US010145862B2

(12) United States Patent
Teranishi et al.

(10) Patent No.: US 10,145,862 B2
(45) Date of Patent: Dec. 4, 2018

(54) PROBE PIN

(71) Applicant: OMRON Corporation, Kyoto-shi, Kyoto (JP)

(72) Inventors: Hirotada Teranishi, Osaka (JP); Takahiro Sakai, Moriyama (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/317,200

(22) PCT Filed: Jun. 4, 2015

(86) PCT No.: PCT/JP2015/066222
§ 371 (c)(1),
(2) Date: Dec. 8, 2016

(87) PCT Pub. No.: WO2015/194385
PCT Pub. Date: Dec. 23, 2015

(65) Prior Publication Data
US 2017/0115324 A1    Apr. 27, 2017

(30) Foreign Application Priority Data
Jun. 16, 2014  (JP) ................. 2014-123529

(51) Int. Cl.
*G01R 1/067*  (2006.01)
*G01R 31/00*  (2006.01)
(Continued)

(52) U.S. Cl.
CPC ....... *G01R 1/06722* (2013.01); *G01R 1/0483* (2013.01); *G01R 1/067* (2013.01);
(Continued)

(58) Field of Classification Search
CPC .......... G01R 1/0483; G01R 1/07342; G01R 1/0735; G01R 1/07378; G01R 31/2886; G01R 1/07307
(Continued)

(56) References Cited

U.S. PATENT DOCUMENTS 7,479,237 B2    1/2009  Tsai et al.
2003/0027423 A1*  2/2003  Zhou ................. G01R 1/06711
                                                                    438/689
(Continued)

FOREIGN PATENT DOCUMENTS

CN    1702463 A    11/2005
CN    1752759 A     3/2006
(Continued)

OTHER PUBLICATIONS

The Japanese office action dated Feb. 6, 2018 in a counterpart Japanese patent application.
(Continued)

*Primary Examiner* — Huy Q Phan
*Assistant Examiner* — Raul Rios Russo
(74) *Attorney, Agent, or Firm* — Metrolexis Law Group, PLLC

(57) ABSTRACT

A probe pin includes a coil spring, a first plunger, a first end of which is inserted from a first end of the coil spring into the coil spring and a second end of which is exposed to outside of the coil spring, and a second plunger, a first end of which is inserted from a second end of the coil spring into the coil spring to be in contact with the first end of the first plunger and a second end of which is exposed to the outside of the coil spring. The second plunger includes at least one elastic arm extending from the second end of the second plunger, and a touch portion is provided at a leading end of the elastic arm and displaceable in a direction intersecting an (Continued)

axial center direction when pressing force in the axial center direction is applied to the touch portion.

11 Claims, 20 Drawing Sheets

(51) Int. Cl.
  *G01R 1/073* (2006.01)
  *G01R 1/04* (2006.01)
(52) U.S. Cl.
  CPC ....... *G01R 1/06738* (2013.01); *G01R 1/0735* (2013.01); *G01R 1/07342* (2013.01); *G01R 1/07378* (2013.01)
(58) Field of Classification Search
  USPC ......... 324/71, 378, 403, 415, 425, 500, 537, 324/755.01, 755.08
  See application file for complete search history.

(56) References Cited

U.S. PATENT DOCUMENTS

| | | | |
|---|---|---|---|
| 2004/0104737 A1 | 6/2004 | Haga et al. | |
| 2006/0073710 A1 | 4/2006 | Hwang | |
| 2007/0167022 A1 | 7/2007 | Tsai et al. | |
| 2010/0120299 A1* | 5/2010 | Osato | H01R 13/2421 439/786 |
| 2010/0244875 A1* | 9/2010 | Chabineau-Lovgren | G01R 1/06722 324/755.11 |
| 2011/0117796 A1* | 5/2011 | Oishi | G01R 1/06722 439/841 |
| 2013/0169301 A1 | 7/2013 | Breinlinger et al. | |
| 2016/0072202 A1* | 3/2016 | Hemmi | H01R 13/2421 439/786 |
| 2017/0074903 A1* | 3/2017 | Teranishi | G01R 1/067 |

FOREIGN PATENT DOCUMENTS

| | | |
|---|---|---|
| CN | 103238077 A | 8/2013 |
| JP | H8-37071 A | 2/1996 |
| JP | 2002-328139 A | 11/2002 |
| JP | 2003-254995 A | 9/2003 |
| JP | 2003-307525 A | 10/2003 |
| JP | 2004-053343 A | 2/2004 |
| JP | 2007-40743 A | 2/2007 |
| JP | 2008-32620 A | 2/2008 |
| JP | 2008-516398 A | 5/2008 |
| JP | 2009-128211 A | 6/2009 |
| JP | 2010-243411 A | 10/2010 |
| JP | 2012-252893 A | 12/2012 |
| WO | 2008075918 A1 | 6/2008 |

OTHER PUBLICATIONS

The extended European search report (EESR) dated Jan. 3, 2018 in a counterpart European application.
The Chinese office action dated Jul. 27, 2018 in a counterpart Chinese patent application.

* cited by examiner

*Fig.2A*     *Fig.2B*     *Fig.2C*
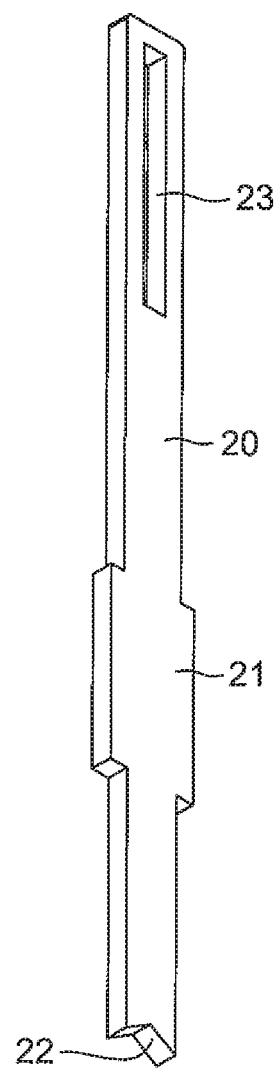
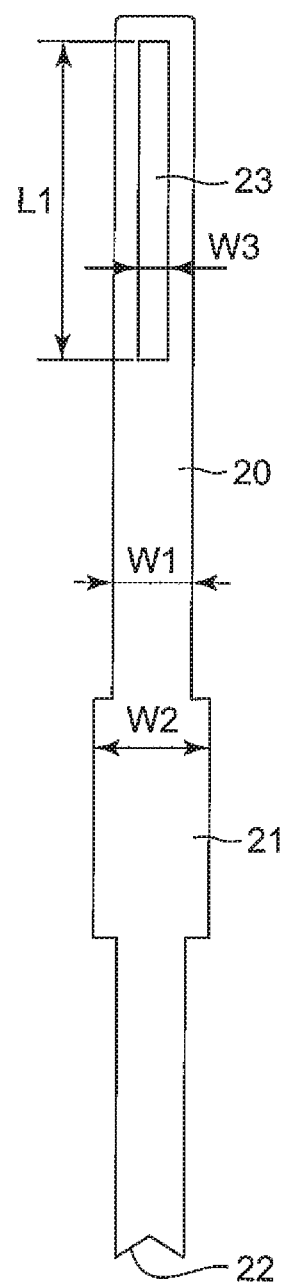
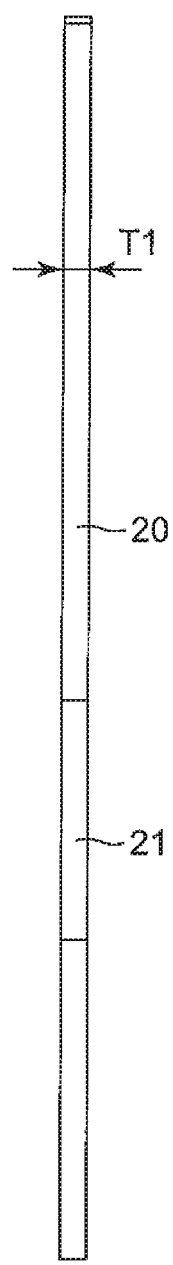

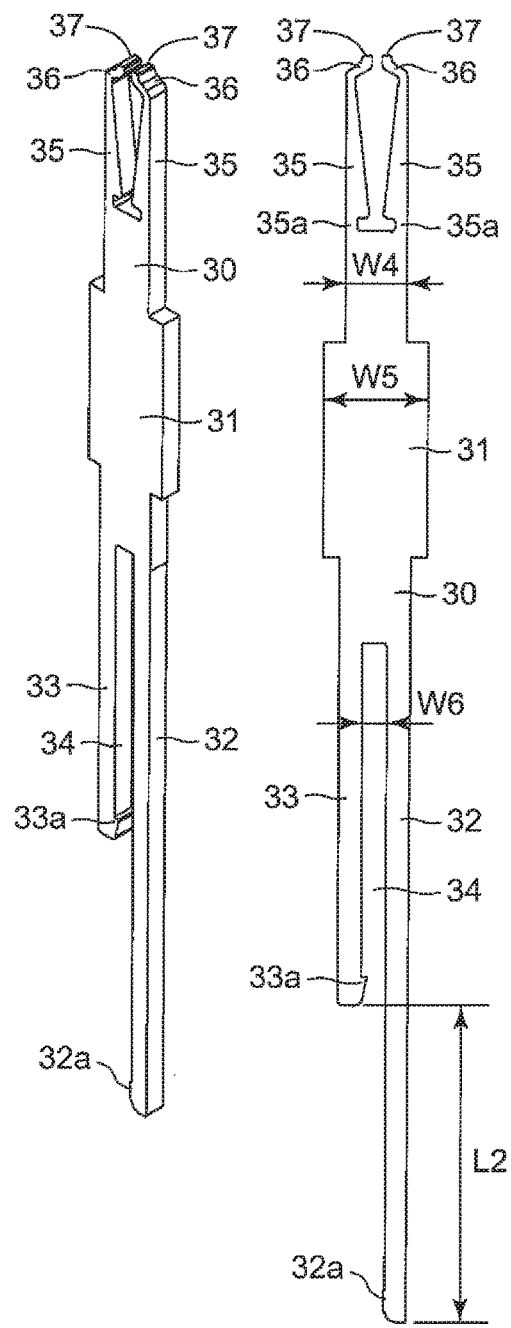
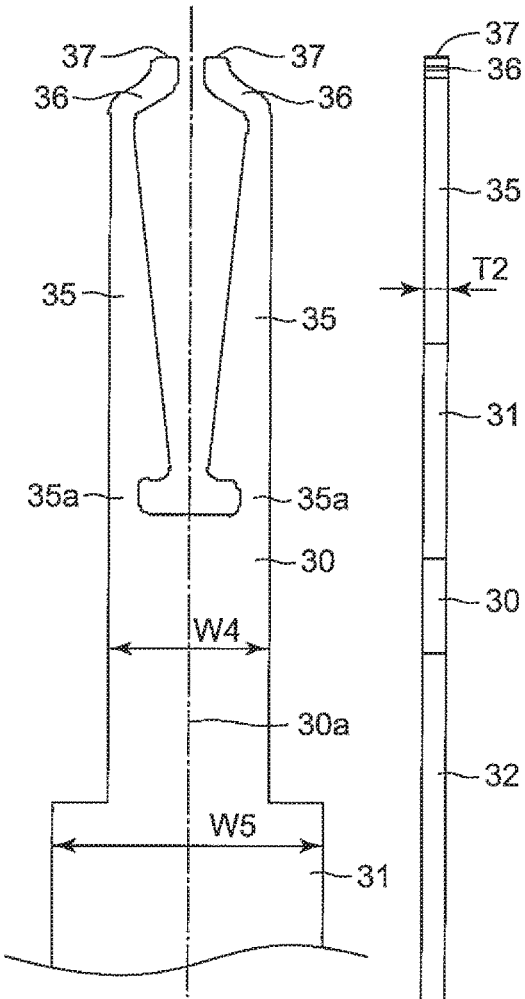
Fig.3A  Fig.3B  Fig.3C  Fig.3D

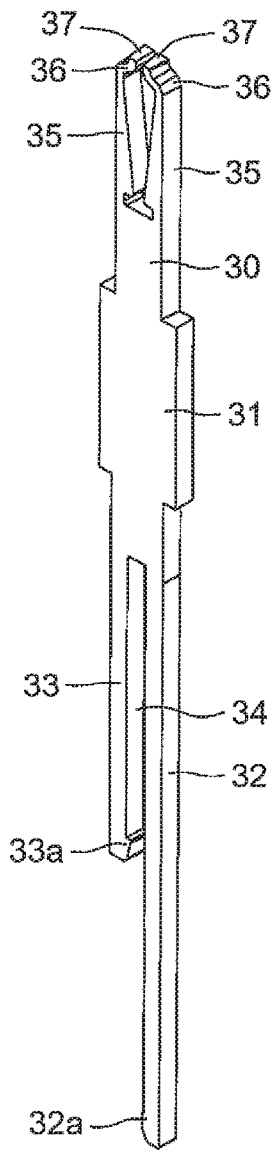
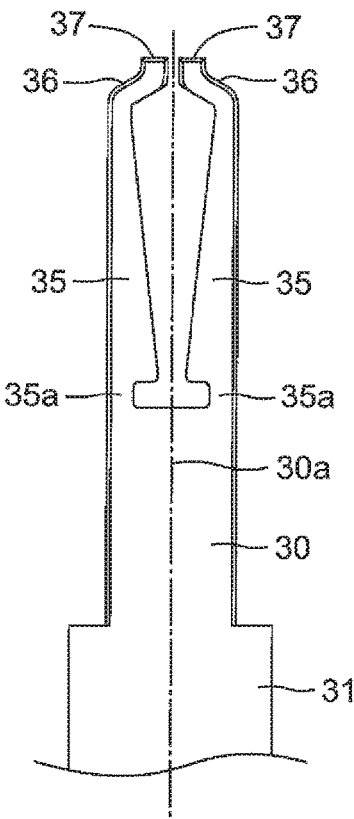
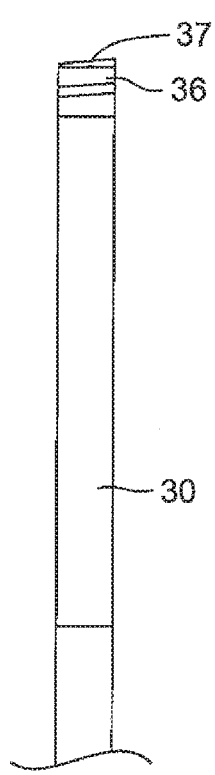
Fig.7A  Fig.7B  Fig.7C
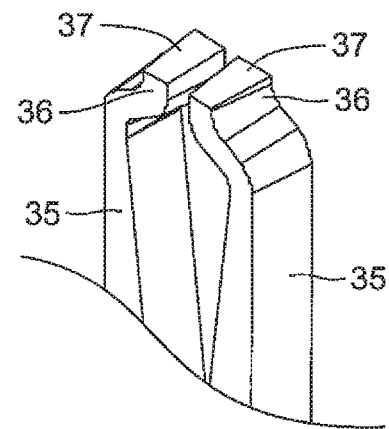
Fig.7D

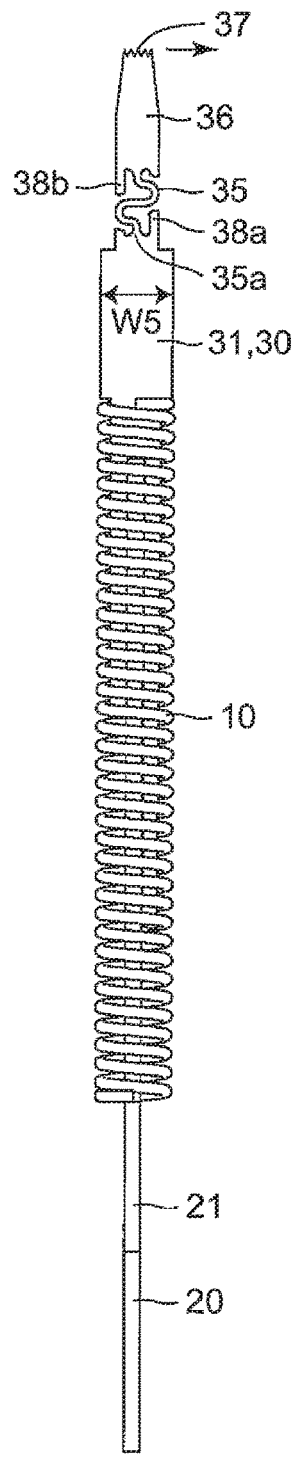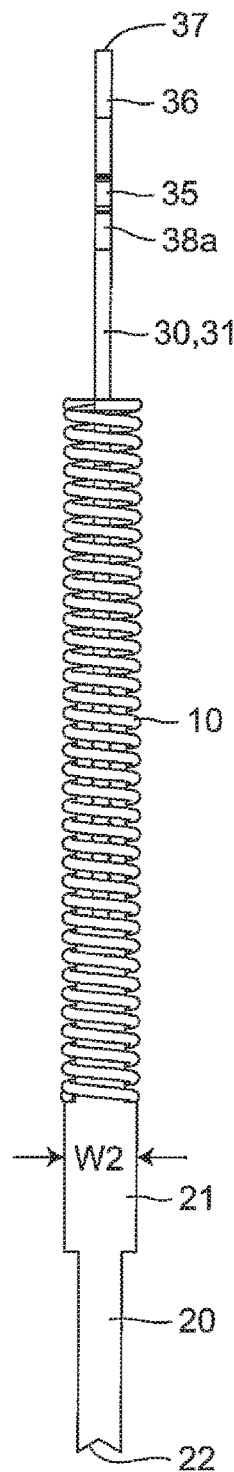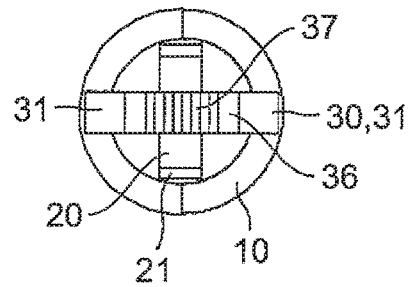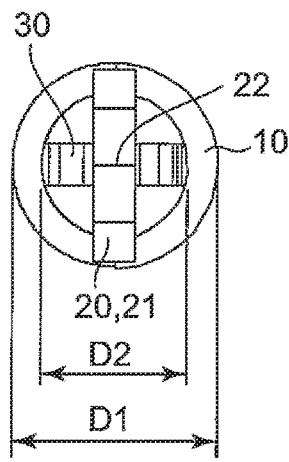

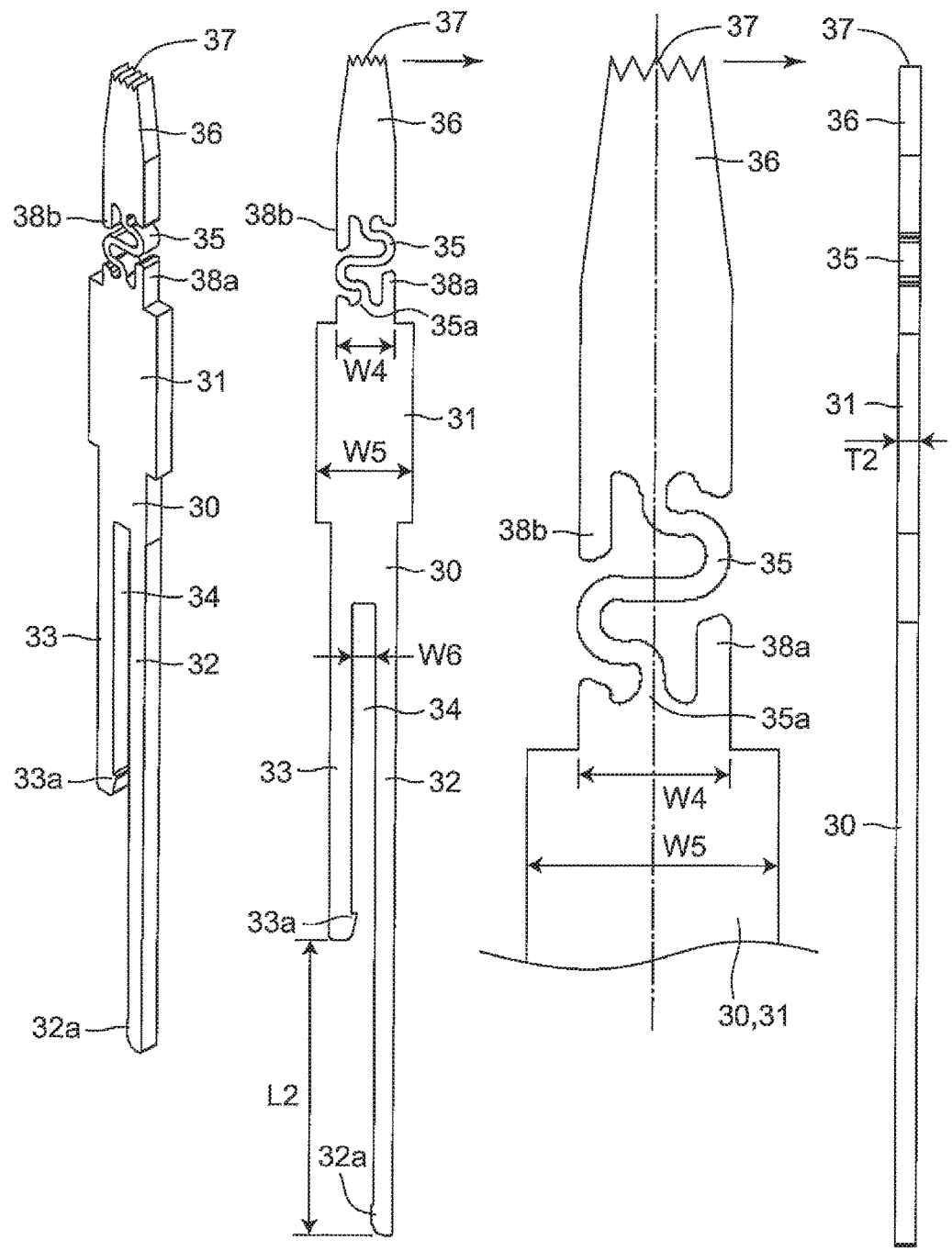

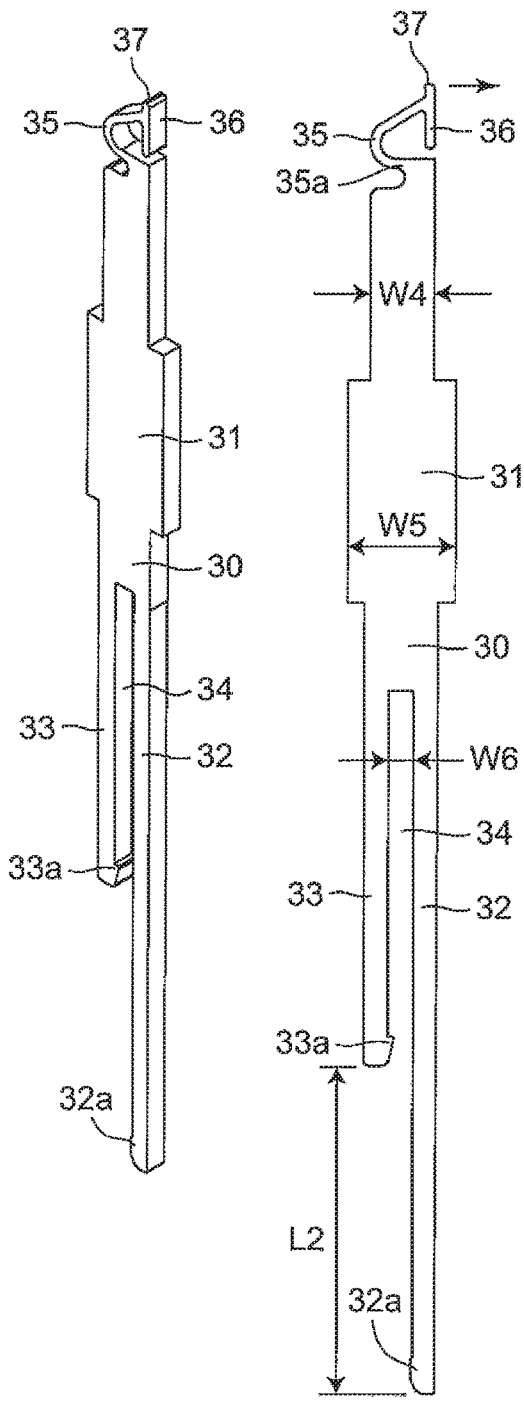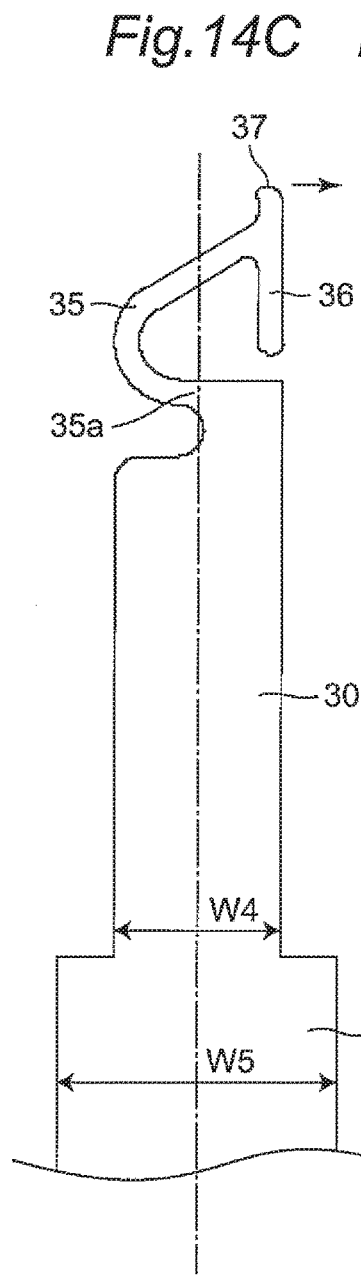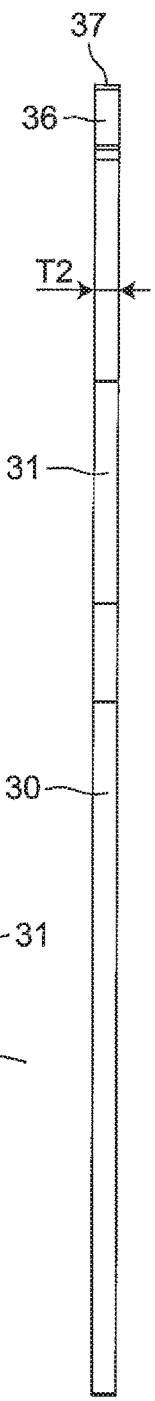
Fig.14A  Fig.14B  Fig.14C  Fig.14D

Fig.18A
Fig.18B
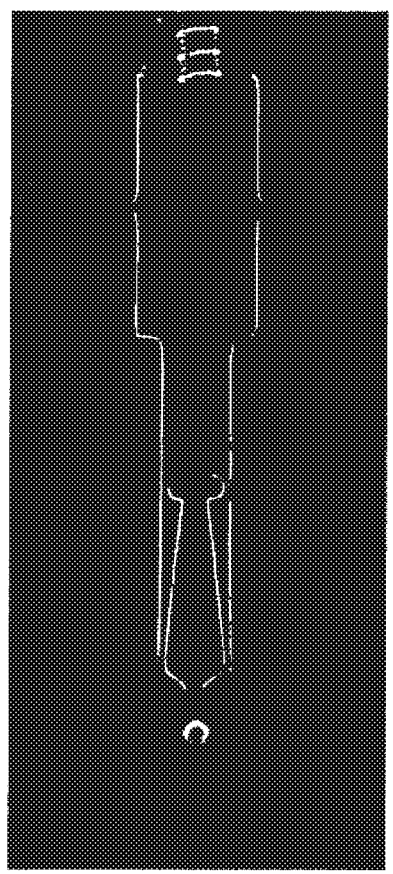
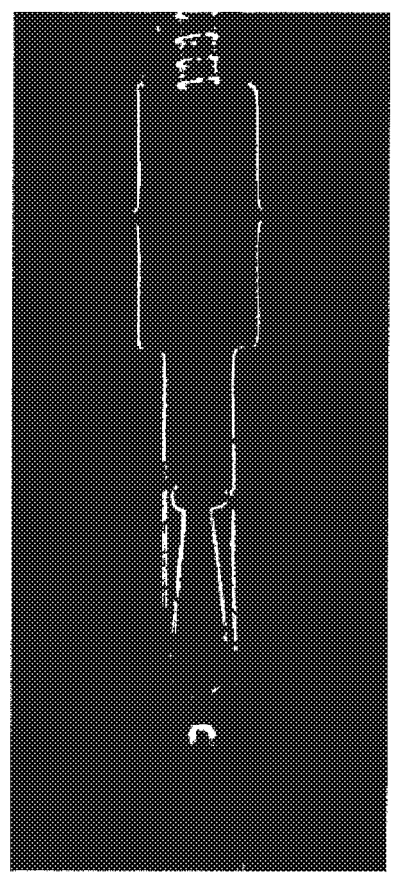

PROBE PIN

TECHNICAL FIELD

The present invention relates to a probe pin, particularly to a probe pin including a wiping function.

BACKGROUND ART

For example, a conventional probe pin including a wiping function (see PTL 1) includes: a first member, a second member, and a spring member.

The first member, which is made of a metallic plate, includes a first opening extending from one end of the first member in a longitudinal direction thereof by a given length a pair of contacts elastically deformable by the first opening, each of the contact including at least a first part separated from each other by a first distance and a second part separated from each other by a second distance larger than the first distance of the first part, and an extending portion extending from the pair of contacts toward the other end of the first member facing the one end The second member, which is made of a metallic plate, includes an engagement portion engaging with the first member and provided at one end of the second member and a second opening extending from the engagement portion in a longitudinal direction thereof by a given length, the engagement portion including e part thicker than the first distance of a first region.

The spring member is configured to bias the first member and the second member in a direction in which the first member and the second member are separated from each other.

In the probe pin, the first member and the second member intersect each other such that the engagement portion of the second member is located in a first opening of the first member, and such that the extending portion of the first member is at least partially located in a second opening of the second member.

When the first member moves in a direction in which the first member approaches the second member, the engagement portion moves from a second region of the pact of contacts to the first region to open the pair of contacts.

In the probe pin, as illustrated in FIGS. 8, 10, and 14 of PTL 1, a pair of contacts 220a and 220b is opened according to sliding of a contact enlarge portion 320 to ensure the wiping function.

CITATION LIST

Patent Literature

PTL 1: JP 2009-128211 A

SUMMARY OF INVENTION

Technical Problem

However, because the contact enlarge portion 320 is opened outward, the probe pin is hardly arrayed with a narrow pitch, and densely integrated probe pins are hardly achievable.

A problem to be solved by the present invention is to provide a probe pin that can be arrayed with a narrow pitch to be densely integrated.

Solution To Problem

To solve the above, problem, a probe pin according to an embodiment of the present invention includes:

a coil spring;

a first lunger, a first end of which is inserted from a first end of the coil spring into the coil spring and a second end of which is exposed to outside of the coil spring; and a second plunger, a first end of which is inserted from a second end of the coil spring into the coil spring to be in contact with the first end of the first plunger and a second end of which is exposed to the outside of the coil spring, characterized in that the second plunger includes at least one elastic arm extending from the second end of the second plunger, and a touch portion is provided at a leading end of the elastic arm and displaceable in a direction intersecting an axial center direction when pressing force in the axial center direction is applied to the touch portion.

Advantageous Effects of Invention

According to the embodiment of the present invention, the touch portion is displaced to perform the wiping operation. Consequently, a contact failure with the test specimen can be prevented and, thereby a lifetime of the probe pin can be extended.

In one embodiment of the present invention, as a point of action, the touch portion may be disposed between a supporting point provided in a base portion of the elastic arm and an axial center.

According to the embodiment, since the touch portion located at the point of action is displaceable toward the axial center, the probe in that performs the wiping operation with a narrow pitch may be obtained.

In one embodiment of the present invention, the touch portion provided at the leading end of the elastic arm extending from the second end of the second plunger may be displaceable toward the axial center by pressing force in the axial center direction.

According to the embodiment, because the touch portion is displaceable toward the axial center, the probe pin that performs the wiping operation with a narrow pitch may be obtained.

In one embodiment of the present invention, the second plunger may include a pair of the elastic arms which are symmetrically disposed.

According to the embodiment, because the pair of the touch portions performs the wiping operation from the right and left toward the inside, the probe pin that performs the more preferable wiping operation may be obtained.

In one embodiment of the present invention, a curved connection portion, which connects the elastic arm and the touch portion, may be provided.

According to the embodiment, since the distance between the supporting point and the point of action is lengthened the connection portion and the probe pin having a large wiping amount may be obtained.

In one embodiment of the present invention, the touch portion may have a V-shape, a corrugated shape, or an apex shape.

According to the embodiment, the probe pin in which the touch portion more effectively performs the wiping operation may be obtained.

In one embodiment of the present invention, the touch portion may have an arc shape.

According to the embodiment, since the touch portion is easily elastically deformed, the probe pin that performs the wiping operation while faithfully tracing a surface of a test specimen may be obtained.

In one embodiment of the present invention, a step portion may be provided in an edge of one of surfaces of the second plunder, the step portion extending at least from the elastic arm toward the touch portion.

According to the embodiment, because the surface and the backside of the second plunger are not linearly symmetrical, torsion moment may act on the elastic arm, and the touch portion may perform the wiping operation while rotating. Therefore, the more preferable wiping action may be obtained.

In one embodiment of the present invention, the second plunger may be provided with a portion at least from the elastic arm to the touch portion of the second plunger, the portion having a trapezoidal shape.

According to the embodiment, because the surface and the backside of the second plunger are not linearly symmetrical, torsion moment may act on the elastic arm, and the touch portion may perform the wiping operation while rotating. Therefore, the more preferable wiping action may be obtained.

In one embodiment of the present invention, the elastic arm extending from the second end of the second plunger may have a bellows shape, and a connection portion including the touch portion may be provided at the leading end of the elastic arm, so that the touch portion is displaceable in a direction intersecting the axial center direction when pressing force in the axial center direction is applied to the touch portion.

According to the embodiment, the probe pin having the large wiping amount may be obtained because the substantial distance between the supporting points from the base portion of the bellows-shaped elastic arm to the touch portion is lengthened.

Because the elastic arm is easily elastically deformed, the probe pin that performs the wiping operation with a low contact pressure may be obtained.

In one embodiment of the present invention, a position regulation protrusion may be provided in at least one of a base portions of the elastic arm.

According to the embodiment, since the position regulation protrusion regulates a position of the connection portion, the probe pin in which damage of the elastic arm is prevented may be obtained.

In one embodiment of the present invention, the elastic arm may extend from the second end of the second plunger so as to be asymmetrically curved, and a connection portion including the touch portion may be provided at the leading end of the elastic arm, so that the touch portion is displaceable in a direction intersecting the axial center direction when pressing force in the axial center direction is applied to the touch portion.

According to the embodiment, the probe pin having the large wiping amount may be obtained because the substantial distance between the supporting points from the base portion of the asymmetrically curved elastic arm to the touch portion is lengthened.

Because the elastic arm is easily elastically deformed, the probe pin that performs the wiping operation with a low contact pressure may be obtained.

An electronic device according to one embodiment of the present invention is characterized by having the probe pin.

According to the embodiment of the present invention, the touch portion is displaced to perform the wiping operation, so that the contact failure with the test specimen can be prevented and the lifetime of the probe pin can be extended.

The touch portion located at the point action is displaced by the pressing force in the axial center direction so as to come closer to the direction intersecting the axial center direction, particularly to the axial center side. Therefore, the probe pin can be arrayed with a narrow pitch, and the electronic device having densely integrated probe pins can be obtained.

BRIEF DESCRIPTION OF DRAWINGS

FIGS. 2A, 2B, and 2C are respectively a perspective view, a front view, and a right side view, illustrating the first plunger in FIGS. 1A to 1D.

FIGS. 3A, 3B, 3C, and 3D are respectively a perspective view, a front view, a partially enlarged front view, and a right side view, illustrating the second plunger in FIGS. 1A to 1D.

FIGS. 7A, 7B, 7C, and 7D are respectively a perspective view, a partially enlarged front view, a partially enlarged side view, and a partially enlarged perspective view, illustrating a second plunger of a probe pin according to a seventh embodiment of the present invention.

FIGS. 8A, 8B, 8C, and 8D are respectively a front view, a right side view, an enlarged plan view, and an enlarged bottom view, illustrating a probe pin according to an eighth embodiment of the present invention.

FIGS. 10A, 10B, 10C, and 10D are respectively a perspective view, a front view, a partially enlarged front view, and a right side view, illustrating the second plunger in FIGS. 8A to 8D.

FIGS. 14A, 14B, 14C, and 14D are respectively a perspective view, a front view, a partially enlarged front view, and a right side view, illustrating the second plunger in FIGS. 12A to 12D.

FIGS. 18A and 18B are respectively photographs illustrating before and after the operation of a probe pin according to WORKING EXAMPLE 3.

DESCRIPTION OF EMBODIMENTS

Figure 1A:
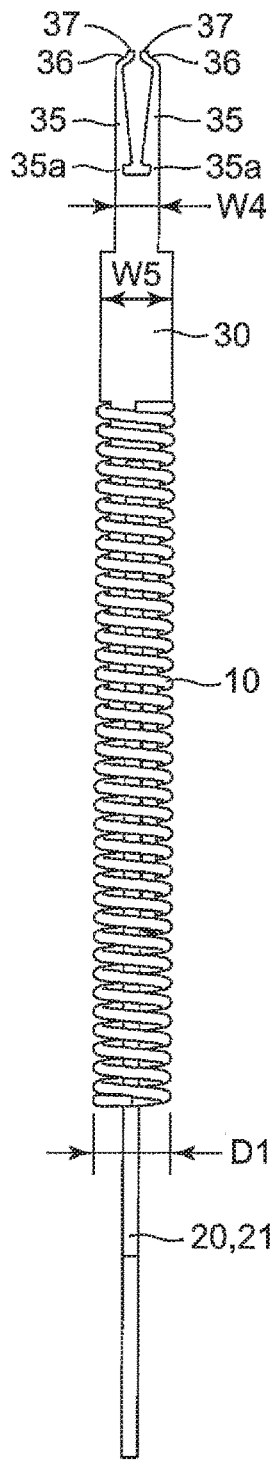
FIGS. 1A, 1B, 1C, and 1D are respectively a front view, a right side view, an enlarged plan view, and an enlarged bottom view, illustrating a probe pin according to a first embodiment of the present invention.
Figure 1B:
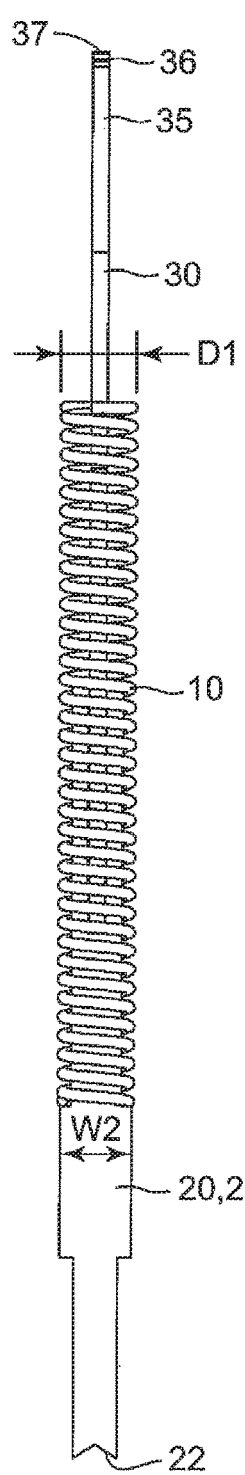
Figure 1C:
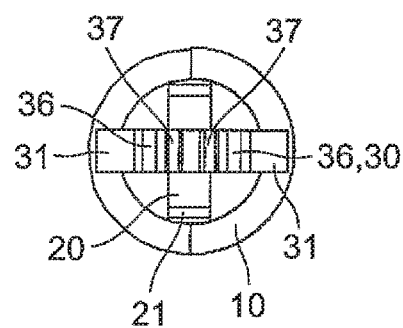
Figure 1D:
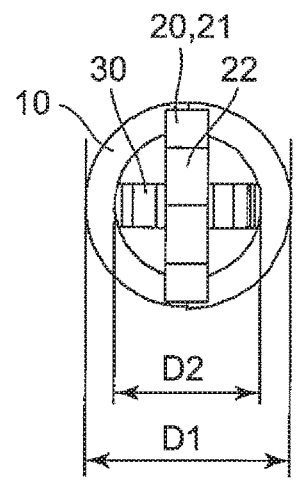

Hereinafter, a probe pin according to exemplary embodiments of the present invention will be described with reference to FIGS. 1A to 1D, 2A to 2C, 3A to 3D, 4A to 4C, 5A to 5H, 6A to 6C, 7A to 7D, 8A to 8D, 9A to 9C, 10A to 10D, 11A to 11C, 12A to 12D, 13A to 13C, 14A to 14D, and 15A to 15C.

As illustrated in FIGS. 1A to 1D, 2A to 2C, 3A to 3D, and 4A to 4C, a probe pin according to a first embodiment includes a coil spring 10, a first plunger 20, and a second plunger 30. The first plunger 20 is inserted from one end (first end) of the coil spring 10 into the coil spring 10 while the second plunger 30 is inserted from the other end (second end) of the coil spring 10 into the coil spring 10. The second plunger 30 is configured to be in contact with and sandwich the first plunger 20.

As illustrated in FIGS. 1A to 1D, the coil spring 10 includes an outer diameter D1 and an inner diameter D2. For example, the coil spring 10 is made of carbon steel or stainless steel. The coil spring 10 is configured to be compressible when the first and second plungers 20 and 30 are assembled, and has a length enough to be able to bias the first and second plungers 20 and 30 in each axial center direction by spring force.

As illustrated in FIGS. 2A to 2C, the first plunger 20 is made by electroplating using a long, conductive plate having a width W1 and a thickness T1, and includes a wide portion 21 having a width W2 in the middle of the first plunger 20. The width W1 of the first plunger 20 is smaller than the inner diameter D2 of the coil spring 10, and the width W2 of the first plunger 20 is substantially equal to the outer diameter D1 of the coil spring 10.

The first plunger 20 includes a touch portion 22 having a substantial V-shape in section at one end of the first plunger 20 and a guide groove 23 formed in a lengthwise direction with a width W3 and a length L1 at the other end of the first plunger 20.

As illustrated in FIGS. 3A to 3D, the second plunger 30 is made by electroplating using a long, conductive plate having a width W4 and a thickness T2, and includes a wide portion 31 having a width W5 in the middle of the second plunger 30. The width W4 of the second plunger 30 is smaller than the inner diameter D2 of the coil spring 10, and the width W5 of the second plunger 30 is substantially equal to the outer diameter D1 of the coil spring 10. The thickness T2 of the second plunger 30 is smaller than the width W3 of the guide groove 23 of the first plunger 20.

The second plunger 30 includes a first elastic leg 32 and a second elastic leg 33 which extend parallelly and downwardly from one end of the second plunger 30. A slit 34 having a width W6 is provided between the first elastic leg 32 and the second elastic leg 33. The width W6 of the slit 34 is greater than or equal to the thickness T1 of the first plunger 20.

The first elastic leg 32 is longer than the second elastic leg 33 by a distance L2. A movable contact 32a is provided at a lower edge in an inward surface of the first elastic leg 32, and a guide protrusion 33a is provided at a lower edge in an inward surface of the second elastic leg 33. The distance L2 is greater than or equal to the length L1 of the guide groove 23.

The second plunger 30 also includes a pair of elastic arms 35 which protrudes upward from the other end of the second plunger 30 so as to be linearly symmetrical. A connection portion 36 which bends inside is provided at leading ends of the elastic arm 35, and a flat touch portion 37 is provided at an upper end of the connection portion 36.

Accordingly, the touch portion 37 is located as a point of action between an axial center 30a of the second plunger 30 and a supporting point 35a in a base portion of the elastic arm 35.

Figure 4A:
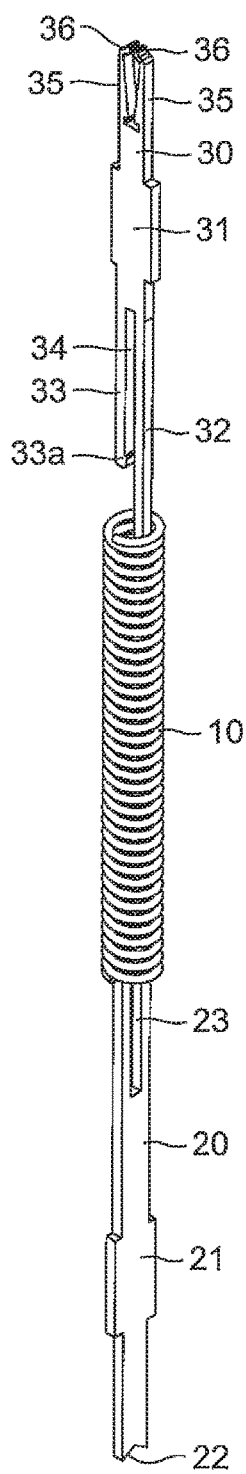
FIGS. 4A and 4B are respectively perspective views illustrating before and after assembly of the probe pin in FIGS. 1A to 1D.
Figure 4B:
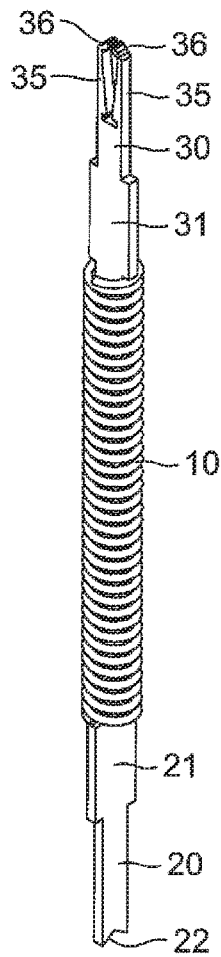
Figure 4C:
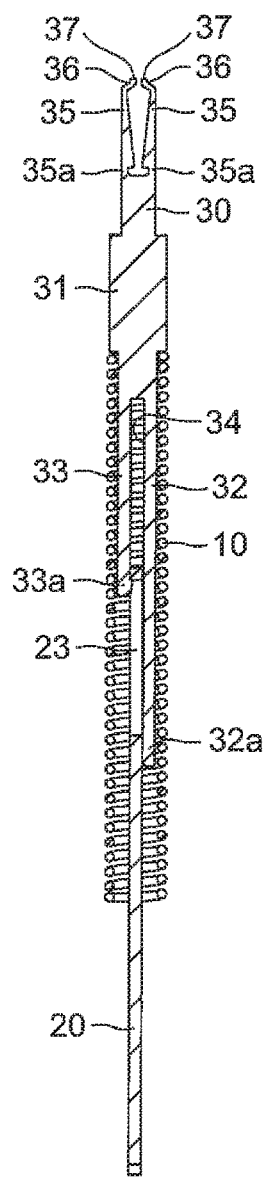
FIG. 4C is a longitudinal sectional view illustrating the probe pin in FIGS. 1A to 1D.

As illustrated in FIG. 4A, when the other end of the first plunger 20 is inserted from one end of the coil spring 10 while the first and second elastic legs 32 and 33 of the second plunger 30 are inserted from the other end of the coil spring 10, the first elastic leg 32 is displaced along the first plunger 20, and the guide protrusion 33a of the second elastic leg 3 is engaged with the guide groove 23. At this point, the distance l2 that is a pushed-out length of the first elastic leg 32 is greater than or equal to the length L1 of the guide groove 23. The movable contact 32a of the first elastic leg 32 is, therefore, always in contact with the first plunger 20, and the guide protrusion. 33a of the second elastic leg 33 engages with the guide groove 23 of the first plunger 20. That is, the first and second elastic legs 32 and 33 are configured to be in contact with and sandwich the first plunger 20.

The wide portion 21 of the first plunger 20 and the wide portion. 31 of the second plunger 30 are configured to engage with both openings of the coil spring 10, respectively, thereby compressing the coil spring 10. Therefore, the first and second plungers 20 and 30 are biased outward along each axial center direction.

When the probe having the above configuration is pushed against a test specimen to load pressing force in the axial center direction, the guide protrusion 33a of the second plunger 30 moves along the guide groove 23 of the first plunger 20 and the movable contact 32a of the second plunger 30 slides on the first plunger 20. At this point, the pressing force acts with the base portion of the elastic arm 35 of the second plunger 30 as the supporting point 35a, bending moment is generated by horizontal component of force, and the touch portion 37 of the connection portion 36 moves toward the axial center 30a, namely, moves inward to perform the wiping operation. This allows that the contact failure caused by dirt adhering to the test specimen is avoided to lengthen a lifetime of the probe pin.

The pair of elastic arms 35 is not necessarily provided, but only one elastic arm 35 may be provided.

Figure 5A:
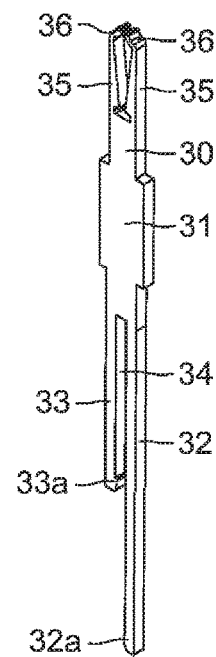
FIGS. 5A and 5B are respectively a perspective view and a partially enlarged view, illustrating a probe pin according to a second embodiment of the present invention.
Figure 5C:
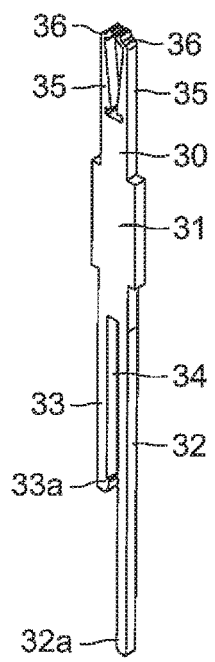
FIGS. 5C and 5D are respectively a perspective view and a partially enlarged view, illustrating a probe pin according to a third embodiment of the present invention.
Figure 5E:
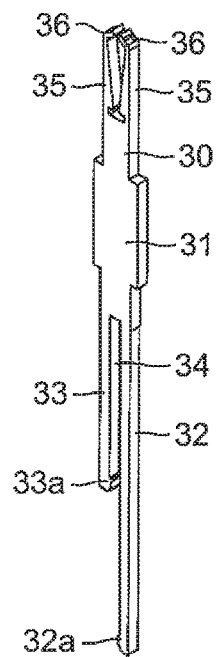
FIGS. 5E and 5F are respectively a perspective view and a partially enlarged view, illustrating a probe pin according to a fourth embodiment of the present invention.
Figure 5G:
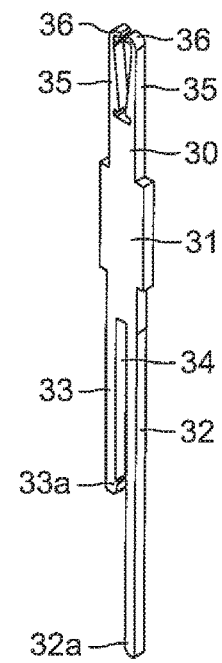
FIGS. 5G and 5H are respectively a perspective view and a partially enlarged view, illustrating a probe pin according to a fifth embodiment of the present invention.
Figure 5B:
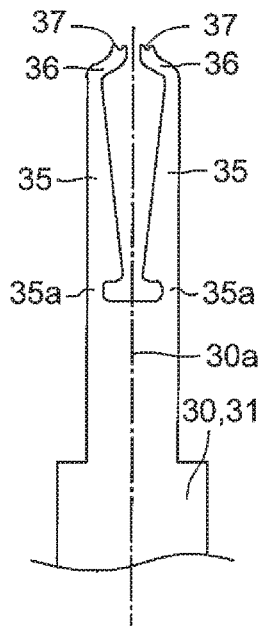
Figure 5D:
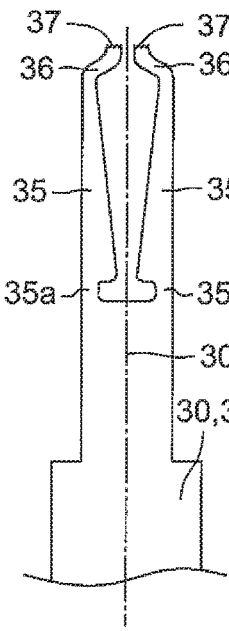

In the probe pin, the touch portion 37 may be formed into a substantial V-shape (second embodiment) as illustrated in FIGS. 5A and 5B, or the touch portion 37 may be formed into a substantially-corrugated shape (third embodiment) as illustrated in FIGS. 5C and 5D.

Figure 5F:
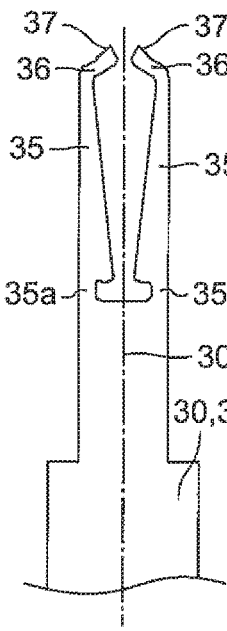
Figure 5H:
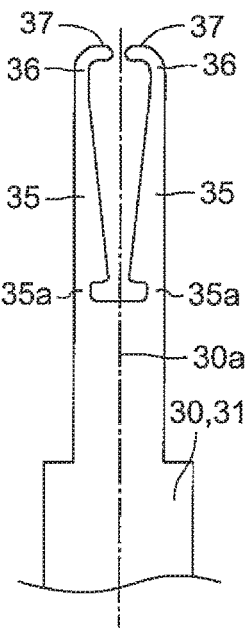

The touch portion 37 may be formed into an apex shape (fourth embodiment) as illustrated in FIGS. 5E and 5F, or the touch portion 37 may be formed into a smoothly arc shape (fifth embodiment) as illustrated in FIGS. 5G and 5H.

Because other configurations of the second to fifth embodiments are similar to those of the first embodiment, the same component is designated by the same reference sign, and the description of the same component is not repeated.

Figure 6A:
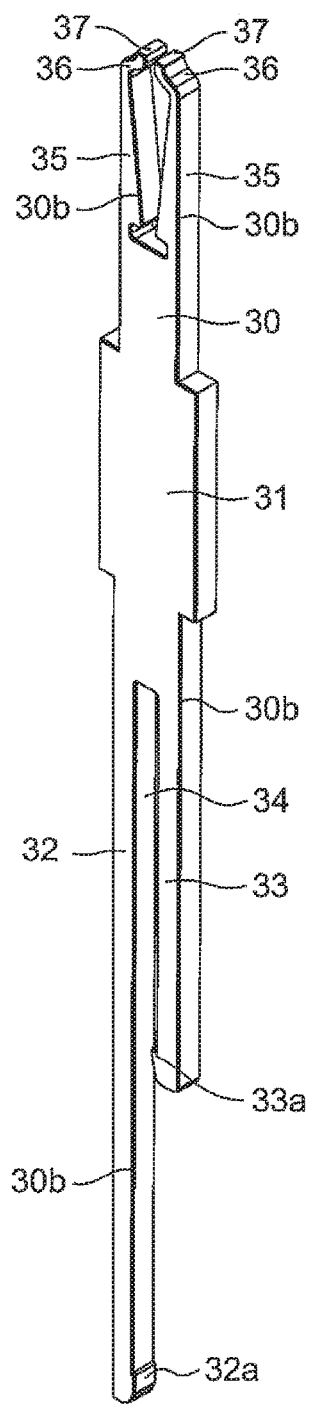
FIGS. 6A, 6B, and 6C are respectively a perspective view, a partially enlarged side view, and a partially enlarged perspective view, illustrating a second plunger of a probe pin according to a sixth embodiment of the present invention.
Figure 6B:
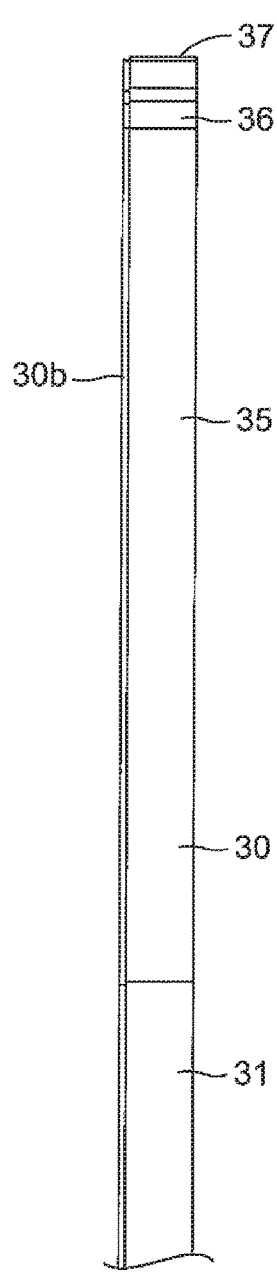
Figure 6C:
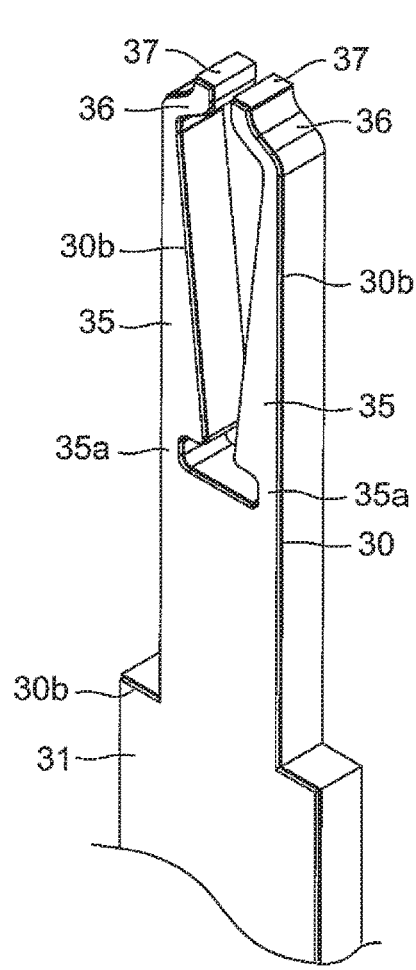
Figure 9A:
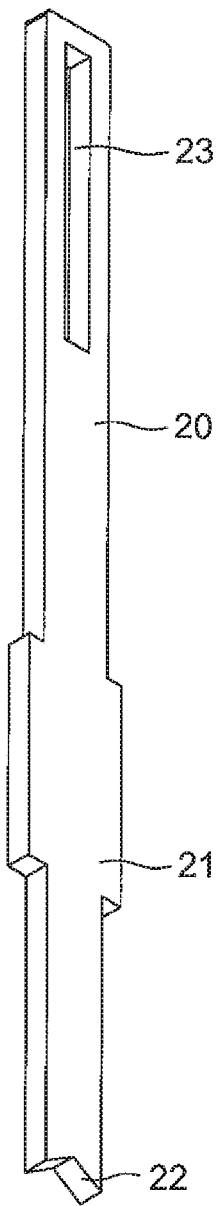
FIGS. 9A, 9B, and 9C are respectively a perspective view, a front view, and a right side view, illustrating the first plunger in FIGS. 8A to 8D.
Figure 9B:
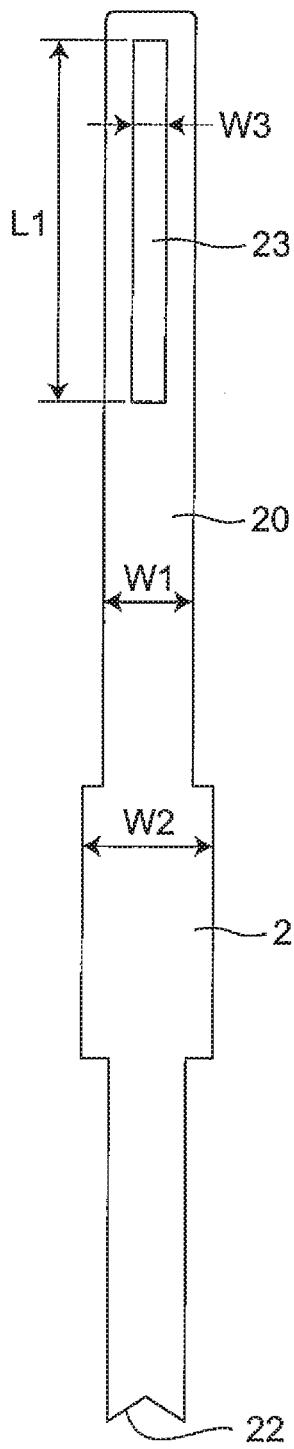
Figure 9C:
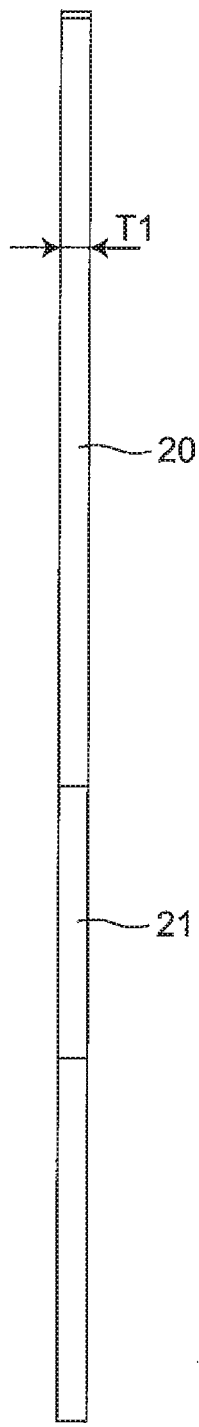
Figure 11A:
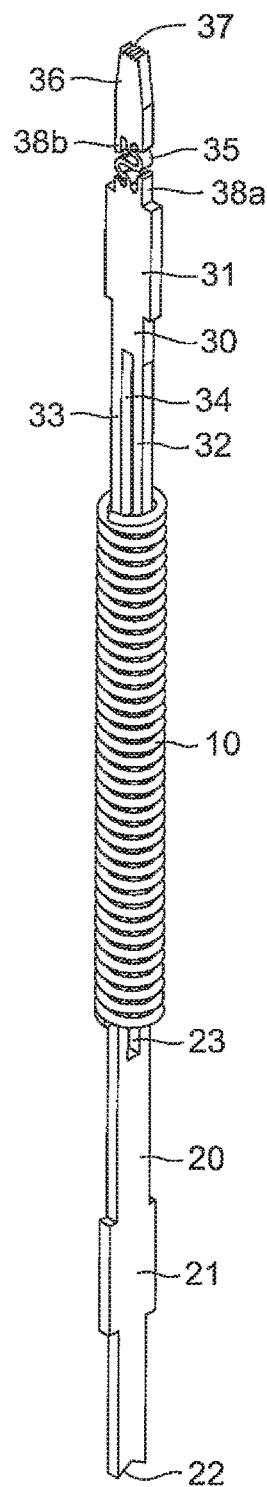
FIGS. 11A and 11B are respectively perspective views illustrating before and after assembly of the probe pin in FIGS. 8A to 8D.
Figure 11B:
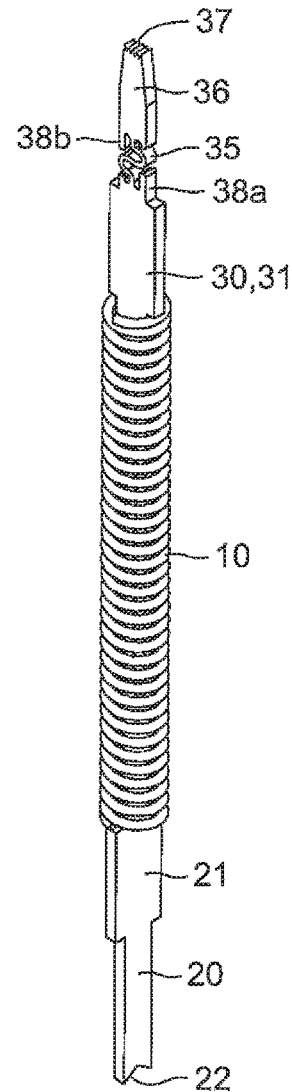
Figure 11C:
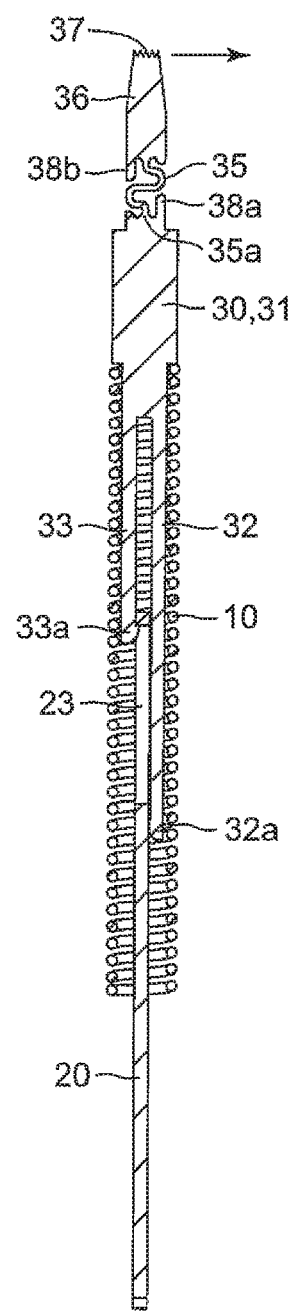
FIG. 11C is a longitudinal sectional view illustrating the probe pin in FIGS. 8A to 8D.
Figure 12A:
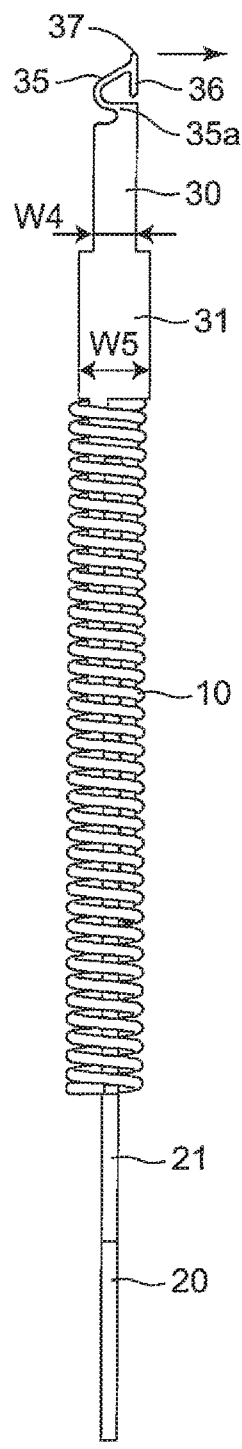
FIGS. 12A, 12B, 12C, and 12D are respectively a front view, a right side view, an enlarged plan view, and an enlarged bottom view, illustrating a probe pin according to a ninth embodiment of the present invention.
Figure 12B:
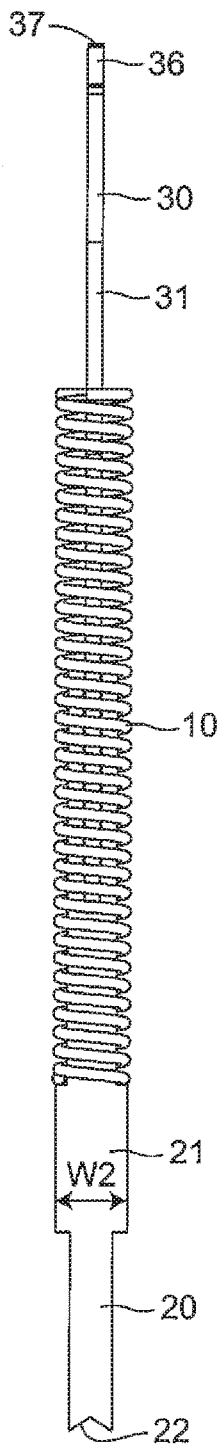
Figure 12C:
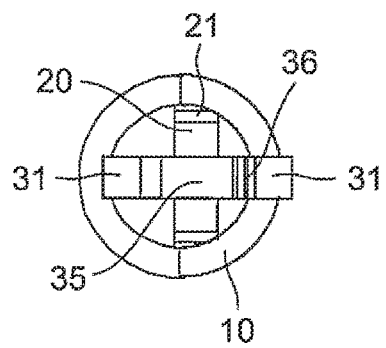
Figure 12D:
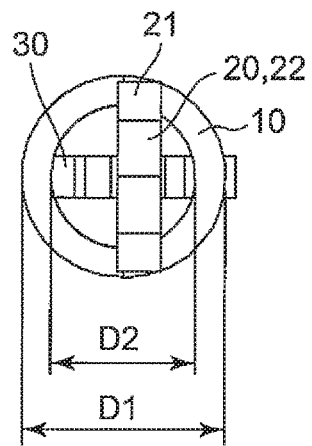
Figure 13A:
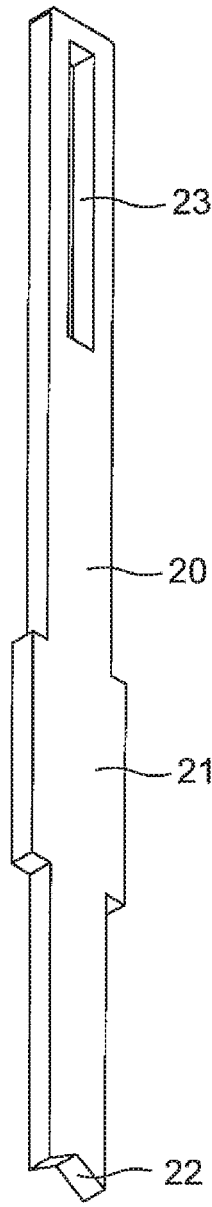
FIGS. 13A, 13B, and 13C are respectively a perspective view, a front view, and a right side view, illustrating the first plunger in FIGS. 12A to 12D.
Figure 13B:
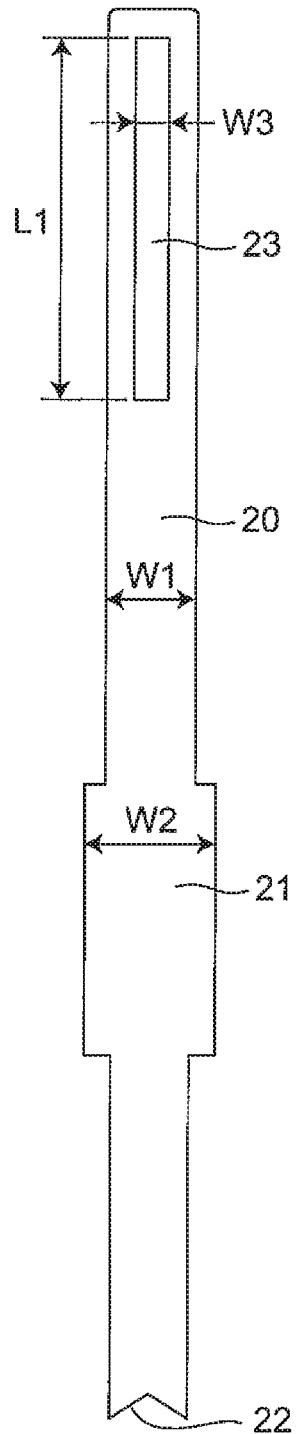
Figure 13C:
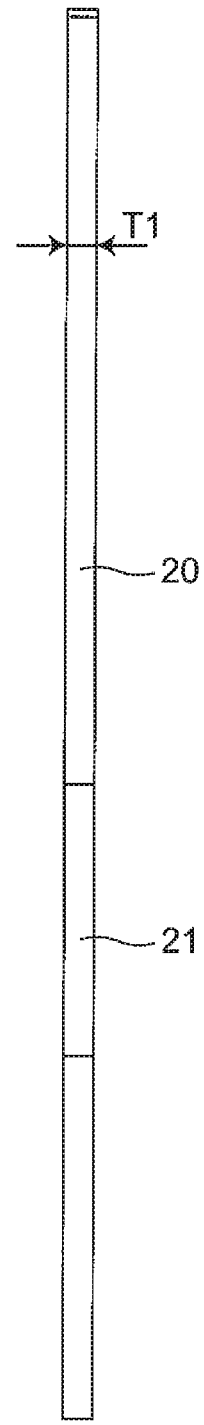
Figure 15A:
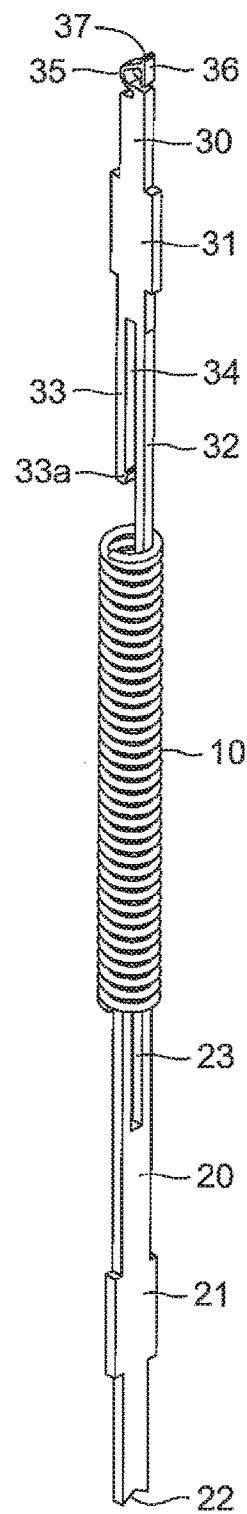
FIGS. 15A and 15B are respectively perspective views illustrating before and after assembly of the probe pin in FIG. 12.
Figure 15B:
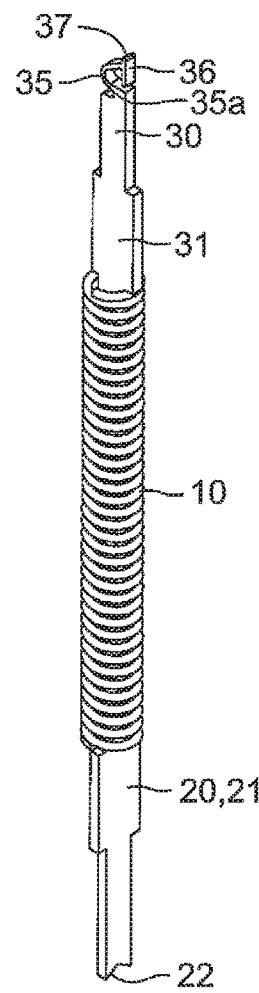
Figure 15C:
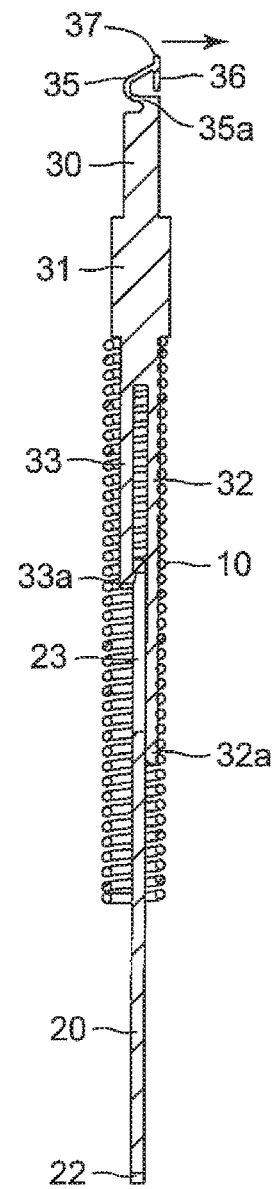
FIG. 15C is a longitudinal sectional view illustrating the probe pin in FIGS. 12A to 12D.

As illustrated in FIGS. 6A to 6C, a probe pin according to a sixth embodiment is almost similar to that of the first embodiment, and different from the first embodiment in that a step 30b is provided along an edge of one of surfaces of the second plunger 30.

In the sixth embodiment, as the step 30b is formed, sections along top/reverse directions of the elastic arm 35, the connection portion 36, and the touch portion 37 are not linearly symmetrical. Therefore, in the case that the pressing force acts on the elastic arm 35 in the axial center direction, torsional moment is generated in the elastic arm 35 and the connection portion 36, and the touch portion 37 performs the wiping action while rotating, thereby obtaining more preferable wiping effect.

Because other configurations of the sixth embodiment are similar to those of the first embodiment, the same component is designated by the same reference sign, and the description of the same component is not repeated.

As illustrated in FIGS. 7A to 7D, a probe pin according to a seventh embodiment is almost similar to that of the first embodiment, and different from the first embodiment in that the elastic arm 35, the connection portion 36, and the touch portion 37 are formed into a substantial trapezoidal shape in section.

In the seventh embodiment, sections along top/reverse directions of the elastic arm 35, the connection portion 36, and the touch portion 37 are not linearly symmetrical. Therefore, in the case that the pressing force acts on the elastic arm 35 in the axial center direction, the torsional moment acts on the elastic arm 35 and the connection portion 36, and the touch portion 37 performs the wiping action while rotating, thereby obtaining more preferable wiping effect.

Because other configurations of the sixth embodiment are similar to those of the first embodiment, the same component is designated by the same reference sign, and the description of the same component is not repeated.

As illustrated in FIGS. 8A to 8D, 9A to 9C, 10A to 10C, and 11A to 11C, a probe pin according to an eighth embodiment is almost similar to that of the first embodiment, and different from the first embodiment in that a connection portion 36 in which a touch portion 37 having a corrugated leading end surface is provided in a bellows-shaped elastic arm 35.

In the base portions at both the ends of the elastic arm 35, position regulation protrusions 38a and 38b, which protrude along the axial center direction, are provided. This allows that damage of the second plunger 30 is prevented when an impermissible load is applied.

In the eighth embodiment, as the touch portion 37 is pushed against the test specimen to apply a load to the test specimen, the elastic arm 35 is bent, the connection portion 36 is displaced in an arrow direction of FIGS. 10B and 10C, and the touch portion 37 performs the wiping action.

In the eighth embodiment, because a distance between supporting points of the elastic arm 35 is lengthened to increase a displacement amount, a large wiping amount can be ensured, and the desired wiping operation can be performed with a low contact pressure.

Because other configurations of the eighth embodiment are similar to those of the first embodiment, the same component is designated by the same reference sign, and the description of the same component is not repeated.

The touch portion 37 may be formed into the substantial V-shape, the apex shape, and the arc shape like the above embodiments.

As illustrated in FIGS. 12A to 12D, 13A to 13C, 14A to 14D, and 15A to 15C, a probe pin according to a ninth embodiment is almost similar to that of the first embodiment, and different from the first embodiment in that a longitudinal connection portion 36 is integrally provided in a leading end of an elastic arm 35 having a substantial C-shape and that a touch portion is provided at a leading end of the connection portion 36.

In the ninth embodiment, when the touch portion 37 is pushed against the test specimen to apply a load to the test specimen, the elastic arm 35 is bent and the connection portion 36 pivots. Consequently, the touch portion 37 is displaced in an arrow direction of FIGS. 14B and 14C, and the touch portion 37 performs the wiping action.

In the ninth embodiment, a distance between supporting points of the elastic arm 35 is lengthened to increase the displacement amount, and the connection portion 36 rotates. Therefore, the large wiping amount can be ensured, the desired wiping operation can be performed with a low contact pressure.

Because other configurations of the eighth embodiment are similar to those of the first embodiment, the same component is designated by the same reference sign, and the description of the same component is not repeated.

The touch portion 37 may be formed into the substantial V-shape, the corrugated shape, the apex shape, and the arc shape like the above embodiments.

Working Example 1

A behavior of the probe pin according to the first embodiment of the present invention is numerical analyzed.

Figure 16:
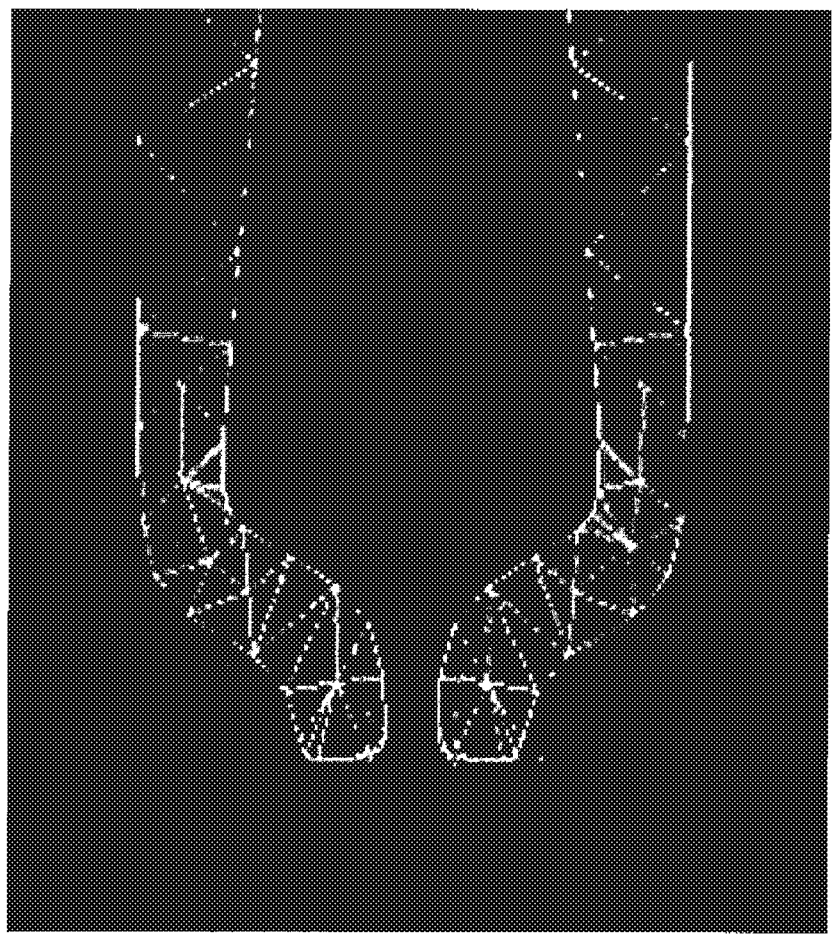
FIG. 16 is a view illustrating an analysis result of WORKING EXAMPLE 1.

The coil spring of the probe pin had the outer diameter or 0.58 mm, and the first and second plungers had the widths W1 and W4 of 0.32 mm and the thicknesses T1 and T2 of 0.12 mm. The behavior of the touch portion was calculated when load of 21 g was applied to the probe pin in the axial center direction of the probe pin. FIG. 16 illustrates a calculation result.

As can be seen from FIG. 16, it was found that the touch portion was displaced toward the axial center side, namely, the inside to perform the wiping operation.

Working Example 2

Figure 17A:
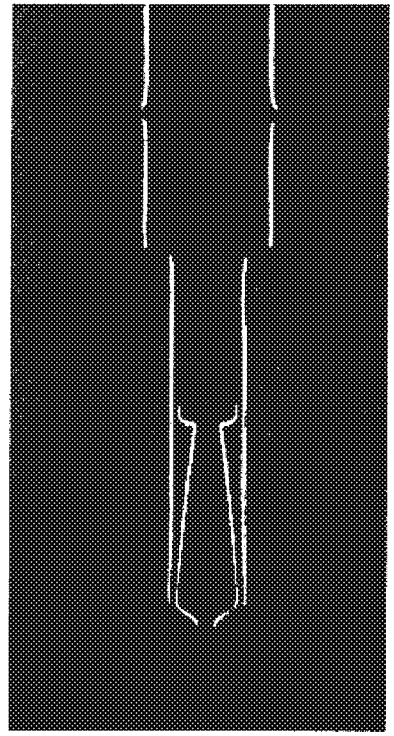
FIGS. 17A and 17B are respectively photographs illustrating before and after the operation of a probe pin according to WORKING EXAMPLE 2.
Figure 17B:
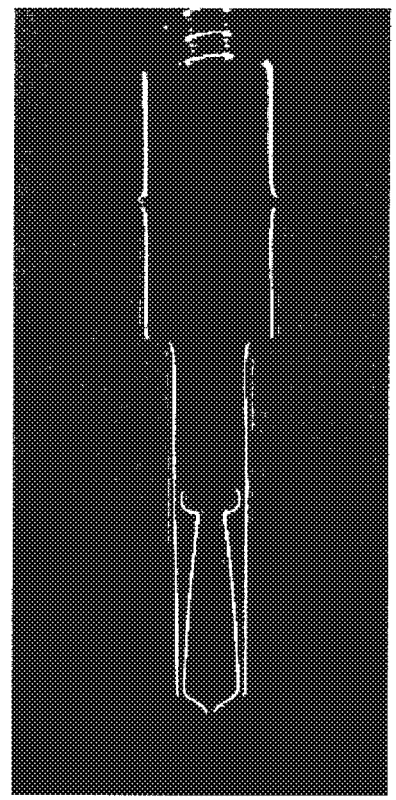

The probe pin according to the first embodiment of the invention was pushed against a flat surface under the same condition as WORKING EXAMPLE 1, and photographed before and after the operation of the touch portion. FIGS. 17A and 17B illustrate photographing results.

As can be seen from FIGS. 17A and 17B, it was confirmed that the pair of touch portions was displaced toward the axial center, namely, the inside to perform the wiping operation similarly to WORKING EXAMPLE 1.

Resultantly, it was confirmed that the touch portion performed the wiping operation in both the numerical analysis and the actual behavior experiment.

Working Example 3

The touch portion of the probe pin according to the first embodiment of the invention was pushed against a dome-shaped solder ball having a diameter of 0.2 mm with pressing force of 21 g, and photographed before and after the operation of the touch portion. FIGS. 18A and 18B illustrate photographing results.

As can be seen from FIGS. 18A and 18B, it was confirmed that the pair of touch portions was displaced toward the axial center, namely, the inside, and the wiping operation was performed even on a spherical surface.

Working Example 4

A behavior of the probe pin of the eighth embodiment is numerical analyzed.

Figure 19:
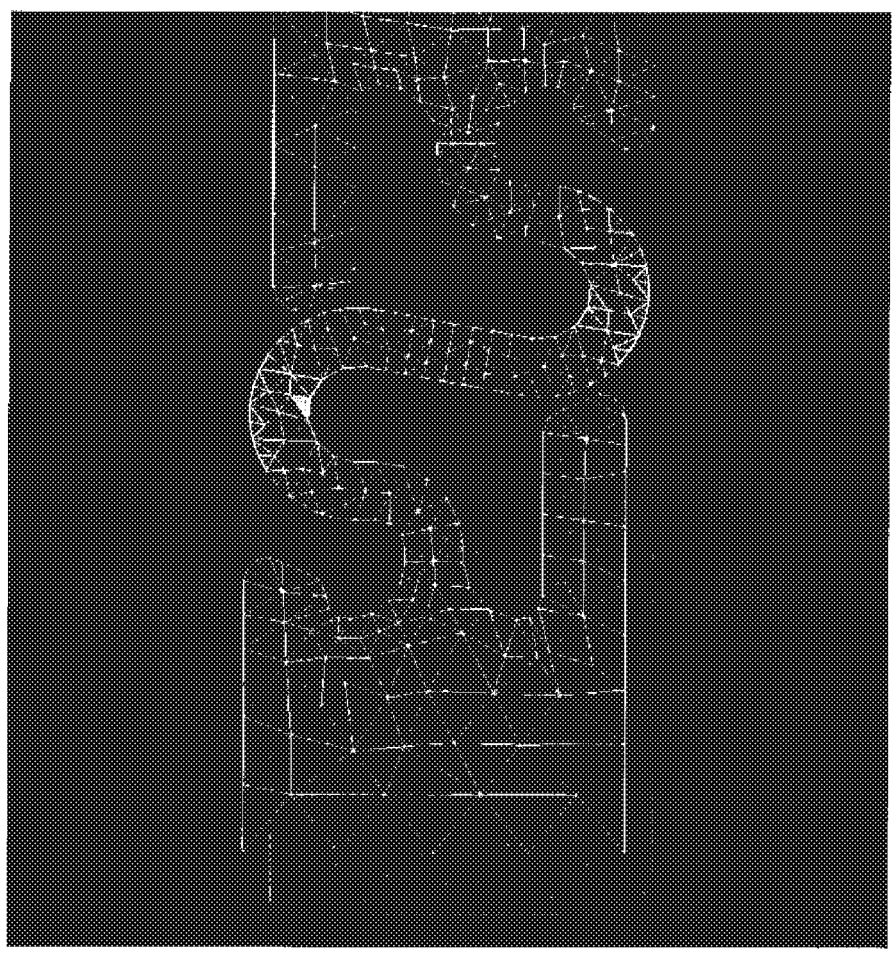
FIG. 19 is a view illustrating an analysis result of WORKING EXAMPLE 4.

The coil spring of the probe pin had the cuter diameter of 0.58 and the first and plungers had the widths W1 and W4 of 0.32 mm and the thicknesses T1 and T2 of 0.12 mm. The behavior of the touch portion was calculated when the load of 21 g was applied to the probe pin in the axial center direction. FIG. 19 illustrates a calculation result.

As can be seen from FIG. 19 it was found that the touch portion was displaced to perform the wiping operation.

Working Example 5

A behavior of the probe pin of the ninth embodiment is numerical analyzed.

Figure 20:
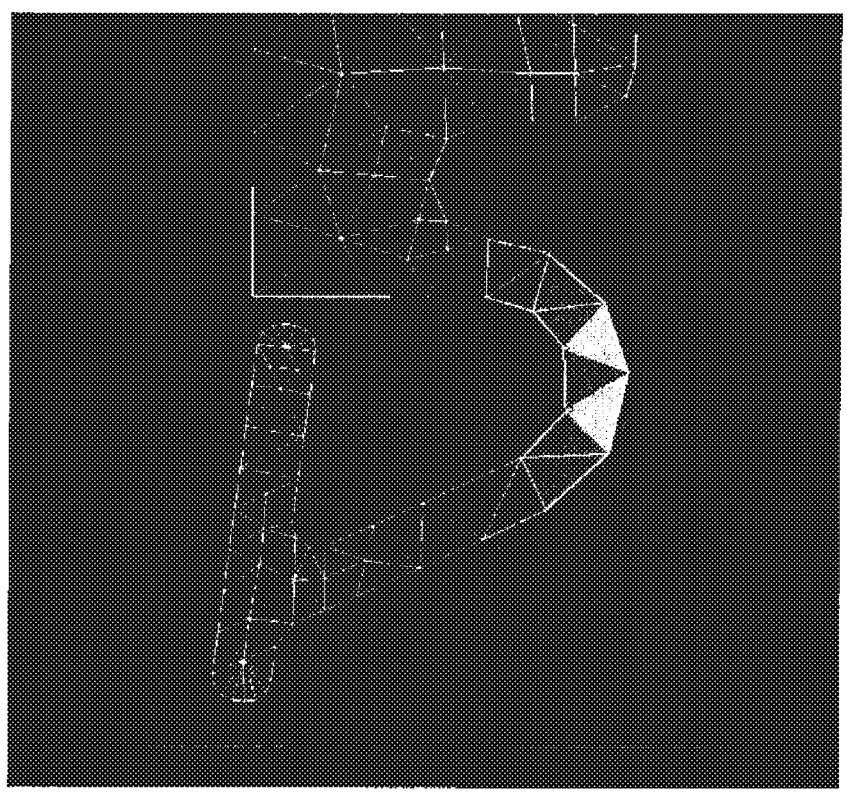
FIG. 20 is a view illustrating an analysis result of WORKING EXAMPLE 5.

The coil spring of the probe pin had the outer diameter of 0.58 mm, and the first and second plungers had the widths W1 and W4 of 0.32 mm and the thicknesses T1 and T2 of 0.12 mm. The behavior of the touch portion was calculated when the load of 21 g was applied to the probe pin in the axial center direction. FIG. 20 illustrates a calculation result.

As can be seen from FIG. 20, it was found that the touch portion was displaced to perform the wiping operation.

INDUSTRIAL APPLICABILITY

The probe pin according to the present invention is not limited to the above embodiments and it may have a different shape from the probe pins of the above embodiments.

REFERENCE SIGNS LIST 10. coil spring
20. first plunger
21. wide portion
22. touch portion
23. guide groove
30. second plunger
30a. axial center
30b. step
31. wide portion
32. first elastic leg
32a. movable contact
33. second elastic leg
33a. guide protrusion
34. slit
35. elastic arm
35a. supporting point
36. connection portion
37. touch portion
38a, 38b. position regulation protrusion

The invention claimed is:

1. A probe pin comprising:
   a coil spring;
   a first plunger, a first end of which is inserted from a first end of the coil spring into the coil spring and a second end of which is exposed to outside of the coil spring; and
   a second plunger, a first end of which is inserted from a second end of the coil spring into the coil spring to be in contact with the first end of the first plunger and a second end of which is exposed to the outside of the coil spring, wherein
   the second plunger includes at least one elastic arm extending from the second end of the second plunger,
   a touch portion is provided at a leading end of the elastic arm and displaceable in a direction intersecting an axial center direction when pressing force in the axial center direction is applied to the touch portion, and
   a step portion is provided along an edge of a surface of the at least one elastic arm of the second plunger.

2. The probe pin as claimed in claim 1, wherein as a point of action, the touch portion is disposed between a supporting point provided in a base portion of the elastic arm and an axial center.

3. The probe pin as claimed in claim 1, wherein the touch portion provided at the leading end of the elastic arm extending from the second end of the second plunger is displaceable toward the axial center by pressing force in the axial center direction.

4. The probe pin as claimed in claim 1, wherein the second plunger includes a pair of the elastic arms which are symmetrically disposed.

5. The probe pin as claimed in claim 1, wherein a curved connection portion, which connects the elastic arm and the touch portion, is provided.

6. The probe pin as claimed in claim 1, wherein the touch portion has a V-shape.

7. The probe pin as claimed in claim 1, wherein the touch portion has a corrugated shape.

8. The probe pin as claimed in claim 1, wherein the touch portion has an apex shape.

9. The probe pin as claimed in claim 1, wherein the touch portion has an arc shape.

10. The probe pin as claimed in claim 1, wherein the second plunger is provided with a portion at least from the elastic arm to the touch portion of the second plunger, the portion having a trapezoidal shape.

11. An electronic device comprising a probe pin claimed in claim 1.

* * * * *